(12) United States Patent
Modekurti et al.

(10) Patent No.: US 11,822,400 B2
(45) Date of Patent: Nov. 21, 2023

(54) HYBRID SINGLE-PHASE/TWO-PHASE COOLING LOOP TO ENHANCE COOLING OF COMPONENTS

(71) Applicant: Lenovo Global Technology (United States) Inc., Morrisville, NC (US)

(72) Inventors: Arvind Modekurti, Cary, NC (US); Jeffrey S. Holland, Newton, NC (US); Vinod Kamath, Raleigh, NC (US)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 0 days.

(21) Appl. No.: 17/708,691

(22) Filed: Mar. 30, 2022

(65) Prior Publication Data
US 2023/0315172 A1    Oct. 5, 2023

(51) Int. Cl.
*G06F 1/20* (2006.01)
*H05K 7/20* (2006.01)
(52) U.S. Cl.
CPC .......... *G06F 1/206* (2013.01); *H05K 7/20763* (2013.01); *G06F 2200/201* (2013.01)
(58) Field of Classification Search
CPC ...................................................... G06F 1/206
See application file for complete search history.

(56) References Cited

U.S. PATENT DOCUMENTS

| | | | | |
|---|---|---|---|---|
| 2016/0274628 A1* | 9/2016 | Chainer | ............. | H05K 7/20354 |
| 2017/0127563 A1* | 5/2017 | Chainer | ............. | H05K 7/20818 |
| 2017/0179001 A1* | 6/2017 | Brunschwiler | ....... | H01L 23/427 |
| 2021/0307209 A1* | 9/2021 | Stefanoski | ......... | H05K 7/20809 |
| 2022/0413570 A1* | 12/2022 | Nagimov | ................... | G06F 1/20 |
| 2022/0413572 A1* | 12/2022 | Heydari | .................. | G06F 1/206 |
| 2023/0065556 A1* | 3/2023 | Gao | .................... | H05K 7/20818 |

* cited by examiner

*Primary Examiner* — Suresh Suryawanshi
(74) *Attorney, Agent, or Firm* — Kunzler Bean & Adamson; Bruce R. Needham

(57) ABSTRACT

An apparatus for a hybrid single-phase/two-phase cooling loop to enhance cooling of components in a computing device is disclosed. The apparatus includes a single-phase cooling loop routed through a first part of a component. The component includes semiconductor devices. The single-phase cooling loop includes a fluid configured to remain in a liquid state after removing heat from the first part of the component. The apparatus includes a two-phase cooling loop routed through a second part of a component. The two-phase cooling loop includes a dielectric fluid configured to at least partially transition from a liquid state to a gas state at a selected temperature of a semiconductor device of the second part of the component while removing heat from the second part of the component.

17 Claims, 6 Drawing Sheets

HYBRID SINGLE-PHASE/TWO-PHASE COOLING LOOP TO ENHANCE COOLING OF COMPONENTS

FIELD

The subject matter disclosed herein relates to cooling of components in a computing device and more particularly relates to a hybrid single-phase/two-phase cooling loop to enhance cooling of components in a computing device.

BACKGROUND

Liquid cooling is often used for computing equipment. Over time, servers and other computing equipment have evolved to provide increased performance. In addition, density of computing equipment has increased in datacenters and other areas with computing equipment, which increases heat load and results in higher flow rates. It is not uncommon for a rack-mounted tray of computing equipment to require a flow rate of about 4 liters per minute, which may increase to around 6 liters per tray per minute with higher power CPUs that are on the horizon.

Typically, single-phase cooling loops are used for cooling computing equipment. A single-phase cooling loop typically transmits a fluid through cooling fins, tubes, etc. and the fluid does not change phase to a gas. Instead, the temperature of the fluid increases as the fluid extracts heat from the computing equipment.

High bandwidth memory ("HBM") complicates cooling requirements due to different temperature requirements of the HBM compared to surrounding computing equipment. Often HBM will have a temperature requirement that is up to 20 degrees Celsius ("C") lower than surrounding components. With the HBM in such close proximity to other equipment with higher temperature requirements, it is difficult to cool the HBM to the required temperature limits and at the same time cool the surrounding components to a higher limit. One solution is to provide cooling fluid to the HBM at a temperature, volume, etc. that will maintain the HBM within temperature limits and then to overcool the surrounding components. Unfortunately, this overcooling solution is inefficient. While HBM is mentioned, the problem of components that are temperature sensitive or have lower temperature limits than surrounding components exists for other components as well.

BRIEF SUMMARY

An apparatus for a hybrid single-phase/two-phase cooling loop to enhance cooling of components in a computing device includes a single-phase cooling loop routed through a first part of a component. The component includes semiconductor devices. The single-phase cooling loop includes a fluid configured to remain in a liquid state after removing heat from the first part of the component. The apparatus includes a two-phase cooling loop routed through a second part of a component. The two-phase cooling loop includes a dielectric fluid configured to at least partially transition from a liquid state to a gas state at a selected temperature while removing heat from a semiconductor device of the second part of the component.

Another apparatus for a hybrid single-phase/two-phase cooling loop to enhance cooling of components in a computing device includes a single-phase cooling loop routed through a first part of each of one or more components of a motherboard. The one or more components include semiconductor devices and the single-phase cooling loop includes a fluid configured to remain in a liquid state after removing heat from the first part of the one or more components. The apparatus includes a two-phase cooling loop routed through a second part of each of the one or more components of the motherboard. The two-phase cooling loop includes a dielectric fluid configured to at least partially transition from a liquid state to a gas state at a selected temperature while removing heat from a a semiconductor device of the second part of the one or more components.

A system for a hybrid single-phase/two-phase cooling loop to enhance cooling of components in a computing device includes a motherboard with one or more components. Each component of the one or more components include a first part and a second part and each of the first part and the second part include semiconductor devices. The system includes a single-phase cooling loop routed through the first part of each of the one or more components of the motherboard. The single-phase cooling loop includes a single-phase fluid configured to remain in a liquid state after removing heat from the first part of each of the one or more components. The system includes a two-phase cooling loop routed through the second part of each of the one or more components of the motherboard. The two-phase cooling loop includes a dielectric fluid configured to at least partially transition from a liquid state to a gas state at a selected temperature while removing heat from a semiconductor device of the second part of the one or more components. The system includes a two-phase pump in the two-phase cooling loop configured to pump the dielectric fluid through the two-phase cooling loop and a single-phase pump in the single-phase cooling loop configured to pump the single-phase fluid through the single-phase cooling loop. The system includes a heat exchanger in the two-phase cooling loop configured to remove heat from the dielectric fluid of the two-phase cooling loop and a cooling tower and/or chiller in the single-phase cooling loop configured to remove heat from the single-phase fluid of the single-phase loop.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
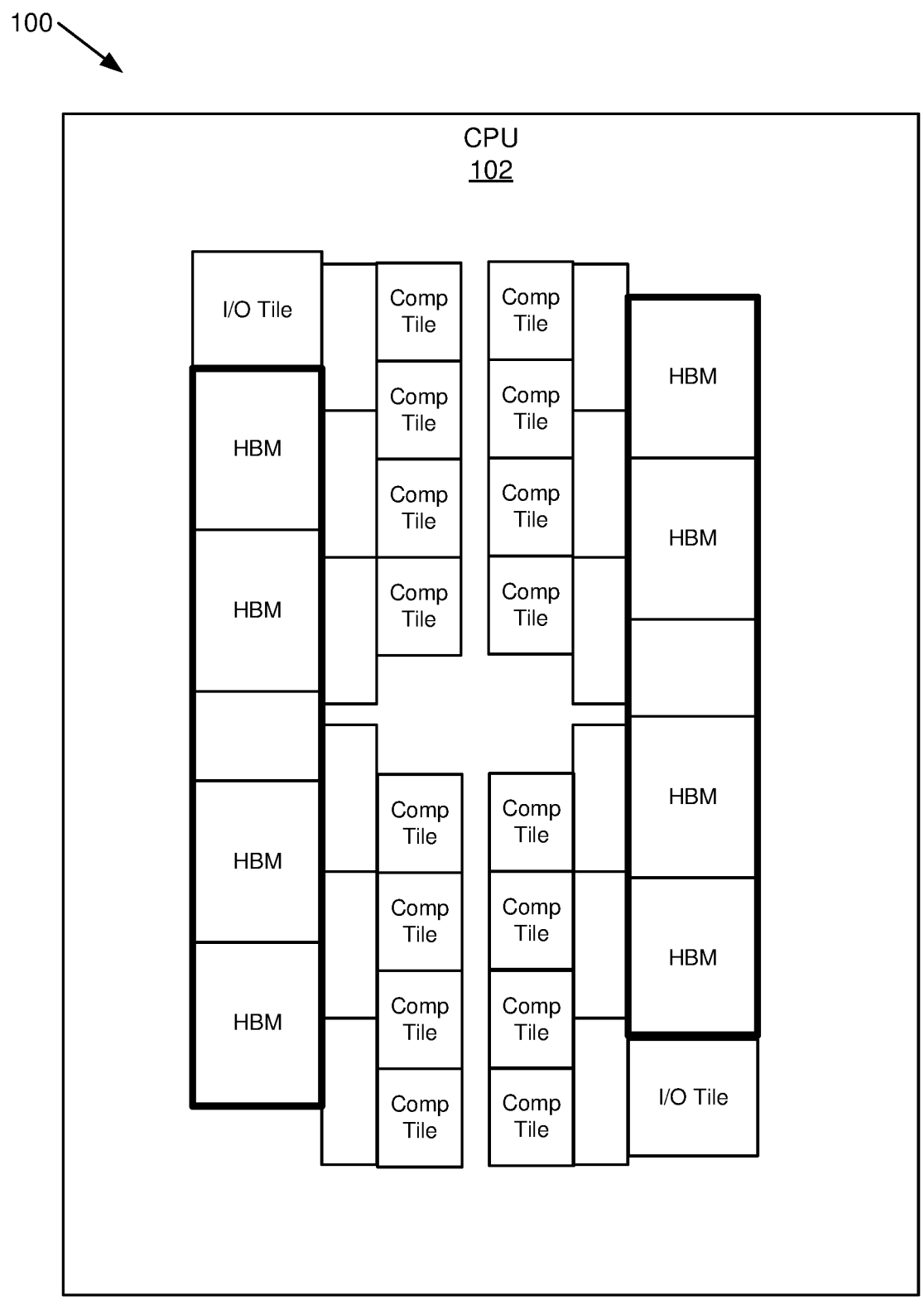
FIG. 1 is a schematic block diagram illustrating a top view of a central processing unit ("CPU") without cooling loops, where areas of the CPU have different temperature requirements, according to various embodiments.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

An apparatus for a hybrid single-phase/two-phase cooling loop to enhance cooling of components in a computing device includes a single-phase cooling loop routed through a first part of a component. The component includes semiconductor devices. The single-phase cooling loop includes a fluid configured to remain in a liquid state after removing heat from the first part of the component. The apparatus includes a two-phase cooling loop routed through a second part of a component. The two-phase cooling loop includes a dielectric fluid configured to at least partially transition from a liquid state to a gas state at a selected temperature of a semiconductor device of the second part of the component while removing heat from the second part of the component.

In some embodiments, the two-phase cooling loop is a closed loop that includes a pump and a heat exchanger for removing heat from the two-phase cooling loop after removing heat from the second part of the component. In other embodiments, the heat exchanger is one of a liquid-to-air heat exchanger or a liquid-to-liquid heat exchanger. In other embodiments, the heat exchanger is a liquid-to-liquid heat exchanger and a first liquid of the heat exchanger is the dielectric fluid and a second liquid of the heat exchanger is the fluid of the single-phase cooling loop.

In some embodiments, the second part of the component includes sections separated from each other and the two-phase cooling loop is split into two or more loops that each traverse a section of the second part of the component. In other embodiments, semiconductor devices of the first part of the one or more components have a temperature requirement higher than a temperature requirement of the semiconductor device of the second part of the one or more components. In other embodiments, the dielectric fluid of the two-phase cooling loop and a pressure of the two-phase cooling loop are selected to maintain the selected temperature of the semiconductor device of the second part of the component. In other embodiments, the single-phase cooling loop cools the first part of one or more components and cools additional components of a motherboard and the two-phase cooling loop cools the second part of two or more components of the motherboard. In other embodiments, the single-phase cooling loop is an open loop. In other embodiments, the fluid of the single-phase cooling loop is water.

Another apparatus for a hybrid single-phase/two-phase cooling loop to enhance cooling of components in a computing device includes a single-phase cooling loop routed through a first part of each of one or more components of a motherboard. The one or more components include semiconductor devices and the single-phase cooling loop includes a fluid configured to remain in a liquid state after removing heat from the first part of the one or more components. The apparatus includes a two-phase cooling loop routed through a second part of each of the one or more components of the motherboard. The two-phase cooling loop includes a dielectric fluid configured to at least partially transition from a liquid state to a gas state at a selected temperature of a semiconductor device of the one or more components while removing heat from the second part of the one or more components.

In some embodiments, the single-phase cooling loop cools one or more additional components of the motherboard. In other embodiments, the two-phase cooling loop is a closed loop that includes a pump and a heat exchanger for removing heat from the two-phase cooling loop after removing heat from the second part of the one or more components. In other embodiments, the heat exchanger is a liquid-to-liquid heat exchanger and a first liquid of the heat exchanger is the dielectric fluid and a second liquid of the heat exchanger is the fluid of the single-phase cooling loop. In other embodiments, semiconductor devices of the first part of the component have a temperature requirement higher than a temperature requirement of the semiconductor device of the second part of the component.

In some embodiments, the second part of each of the one or more components includes sections separated from each other and the two-phase cooling loop is split into two or more loops that each traverse a section of the second part of each of the one or more components. In other embodiments, the dielectric fluid of the two-phase cooling loop and a pressure of the two-phase cooling loop are selected to maintain the selected temperature of the semiconductor device of the second part of the one or more components. In other embodiments, the second part of each of the one or more components include sections separated from each other and the two-phase cooling loop is split into two or more loops that each traverse a section of the second part of the one or more components.

A system for a hybrid single-phase/two-phase cooling loop to enhance cooling of components in a computing device includes a motherboard with one or more components. Each component of the one or more components include a first part and a second part and each of the first part and the second part include semiconductor devices. The system includes a single-phase cooling loop routed through the first part of each of the one or more components of the motherboard. The single-phase cooling loop includes a single-phase fluid configured to remain in a liquid state after removing heat from the first part of each of the one or more components. The system includes a two-phase cooling loop routed through the second part of each of the one or more components of the motherboard. The two-phase cooling loop includes a dielectric fluid configured to at least partially transition from a liquid state to a gas state at a selected temperature of a semiconductor device of the one or more components while removing heat from the second part of the one or more components. The system includes a two-phase pump in the two-phase cooling loop configured to pump the dielectric fluid through the two-phase cooling loop and a single-phase pump in the single-phase cooling loop configured to pump the single-phase fluid through the single-phase cooling loop. The system includes a heat exchanger in the two-phase cooling loop configured to remove heat from the dielectric fluid of the two-phase cooling loop and a cooling tower and/or chiller in the single-phase cooling loop configured to remove heat from the single-phase fluid of the single-phase loop.

In some embodiments, the motherboard includes one or more additional components and the single-phase cooling loop cools the one or more additional components.

FIG. 1 is a schematic block diagram 100 illustrating a top view of a central processing unit ("CPU") 102 without cooling loops, where areas of the CPU have different temperature requirements, according to various embodiments.

FIG. 1 depicts the various components of the CPU 102. The CPU 102 depicted in FIG. 1 is representative of an architecture with particular cooling requirements where the embodiments described herein are useful. The CPU 102 includes four identical sections, each with four compute tiles, an input/output ("I/O") section, other components, and high bandwidth memory ("HBM"). HBM is one example of a component that often has temperature requirements different than other components of a CPU, such as compute tiles, I/O components, cache, etc., or other computing devices.

As stated above, having a component with a temperature requirement that different than surrounding components poses a dilemma. A solution of using one single-phase cooling loop with fluid temperatures and cooling capacity tailored for the temperature sensitive component typically results in overcooling the surrounding components. A better solution is described herein and includes a single-phase cooling loop routed through a first part of a component, such as a CPU 102, where the fluid of the single-phase cooling loop remains in a liquid state after removing heat from the first part of the component and a two-phase cooling loop routed through a second part of the component. The two-phase cooling loop includes a dielectric fluid configured to at least partially transition from a liquid state to a gas state at a selected temperature of a semiconductor device of the second part of the component while removing heat from the second part of the component. The second part includes the HBM or other temperature sensitive component.

Figure 2:
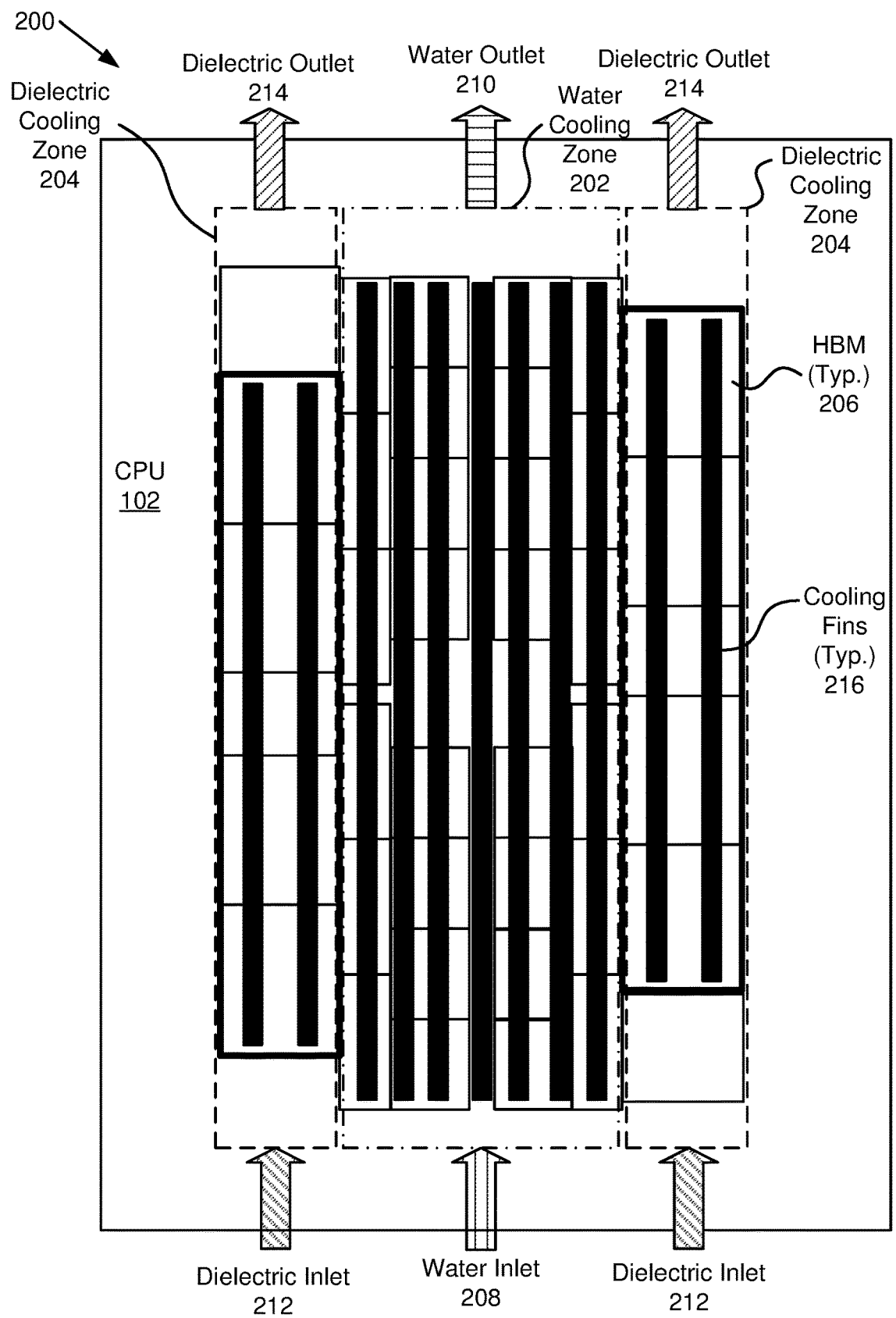
FIG. 2 is a schematic block diagram illustrating the CPU of FIG. 1 with cooling fins for two-phase dielectric cooling and for single-phase water cooling, according to various embodiments.

FIG. 2 is a schematic block diagram 200 illustrating the CPU 102 of FIG. 1 with cooling fins for two-phase dielectric cooling and for single-phase water cooling, according to various embodiments. The names of the components have been removed for clarity, but are the same as the CPU 102 in FIG. 1. The CPU 102 includes a first part with a water cooling zone 202 and a second part with two dielectric cooling zones 204. The dielectric cooling zones 204 are located over the HBM dies 206. The water cooling zone 202 is fed by a water inlet 208 and the water flows to the water outlet 210 at the top. While the water inlet 208 and water outlet 210 are depicted on opposite sides of the CPU 102, in other designs the water inlet 208 and water outlet 210 are on different sides or in different directions. While the CPU 102 in FIG. 2 includes a water cooling zone 202, in other embodiments, another fluid is used that is appropriate for a single-phase cooling loop. The single-phase cooling loop, in some embodiments, is an open loop. In other embodiments, the single-phase cooling loop is a closed loop, which is appropriate for certain fluids.

The water cooling zone 202 provides cooling to components of the CPU 102 that typically have different temperature requirements, such has a higher allowable temperature limit. The dielectric cooling zones 204 are adjacent to the water cooling zone 202 and provide cooling to one or more components with different temperature requirements than the components cooled by the water cooling zone 202. In some examples, the components cooled by the dielectric cooling zones 204 provide cooling for components that are more temperature sensitive than the components cooled by the water cooling zone 202, such as HBM 206.

The dielectric cooling zones 204 each include a dielectric inlet 212 and a dielectric outlet 214. While the dielectric inlet 212 and the dielectric outlet 214 are depicted on opposite ends of the CPU 102, in other embodiments, the dielectric inlet 212 and the dielectric outlet 214 are on different sides and may be on a same side of the CPU 102. The water cooling zone 202 and the dielectric cooling zones 204 are depicted with cooling fins 216, which are the depicted as black vertical rectangles.

In some embodiments, components of the CPU 102 that are cooled by the water cooling zone 202 and the dielectric cooling zones 204 may include a heat sink thermally coupled to the components and to the cooling fins 216 and the water and dielectric fluid circulate around the cooling fins 216. Typically, the cooling fins 216 and/or heat sink are enclosed by a cover and sides so that pipes with the particular cooling fluids enter and exit the enclosures with the cooling fins 216. Other embodiments include other devices to transfer heat from the components of the CPU 102 to the water and/or dielectric fluid, such as a heat pipe, piping that travels back-and-forth across the components, etc. Beneficially, having a single-phase cooling zone (e.g. the water cooling zone 202) over less temperature sensitive components of a device such as a CPU 102 and having two-phase cooling zones (e.g. the dielectric cooling zones 204) over more temperature sensitive components provides an economical means for cooling components with varying temperature requirements that are in close proximity.

Manufacturers are moving to water temperature standard, called American Society of Heating, Refrigeration, and Air-Conditioning Engineers ("ASHRAE") W45 that dictates that computing components be able to handle inlet water temperatures 45 degrees C., which is higher than earlier standards. This increased inlet water temperature compounds issues with components that can tolerate the 45 degree C. inlet water and adjacent components that are more temperature sensitive, such as HBM 206. A CPU 102 or other component may be downstream from a fluid inlet and may see fluid temperatures around 50 degrees C. Exit fluid may leave at temperatures of 55-60 degrees C. A temperature sensitive component may not tolerate such high temperatures.

Where a CPU with one single-phase cooling loop is used, the flow rate for the single-phase loop may be as high as 6 liters per minute to cool a first part with typical semiconductor devices and a second part with temperature sensitive components. Future components, such as next generation CPUs may increase the flow rates to unacceptable levels. Cooling the component with a first part that includes a single-phase loop and a second part with a two-phase loop helps to reduce flow rates. A component with one single-phase cooling loop with a flow rate in the 4-6 liters per minute range may have a single-phase cooling loop with a flow rate in the 2-3 liters per minute range and a two-phase cooling loop with flow rates in the 0.25-1 liter range.

The two-phase loop, in some embodiments, is designed with a flow rate, pressure, and/or dielectric fluid type to maintain a temperature sensitive component at or below a selected temperature. The selected temperature, in some embodiments, is related to a temperature requirement for the temperature sensitive component. In some examples, the selected temperature is chosen to be below a temperature limit for the temperature sensitive component. For example, the two-phase loop may supply dielectric fluid at 45 degrees C. and the selected temperature may be 47 degrees C. so the two-phase loop is designed to transition from a liquid state to a gas state at or around 47 degrees C. For example, the selected temperature may have a range of 46-48 degrees C., or 45-50 degrees C. As the dielectric fluid reaches the selected temperature when absorbing heat from the temperature sensitive component, the dielectric fluid typically stays at or below the selected temperature until all or substantially all of the liquid transitions to a gas state. Different dielectric fluids have different properties and factors such as area around cooling fins, a volume of the cooling space above the temperature sensitive component, etc. affect temperature drift as the dielectric fluid transitions to a gas state. One of skill in the art will recognize various characteristics of potential dielectric fluids, mechanical design of a cooling space above the temperature sensitive component, etc. and how the characteristics affect temperature rise of the dielectric fluid.

The dielectric fluid may be any fluid that transitions from a liquid state to a gas state at a specified temperature. In some embodiments, the dielectric fluid is chosen from a group of potential dielectric fluids that meet certain governmental standards, such as environmental standards. Examples of dielectric fluids may include Fuorinert Electronic Liquid by 3M®, Novec 7000 by 3M, and the like. One of skill in the art will recognize other potential dielectric fluids.

Figure 3:
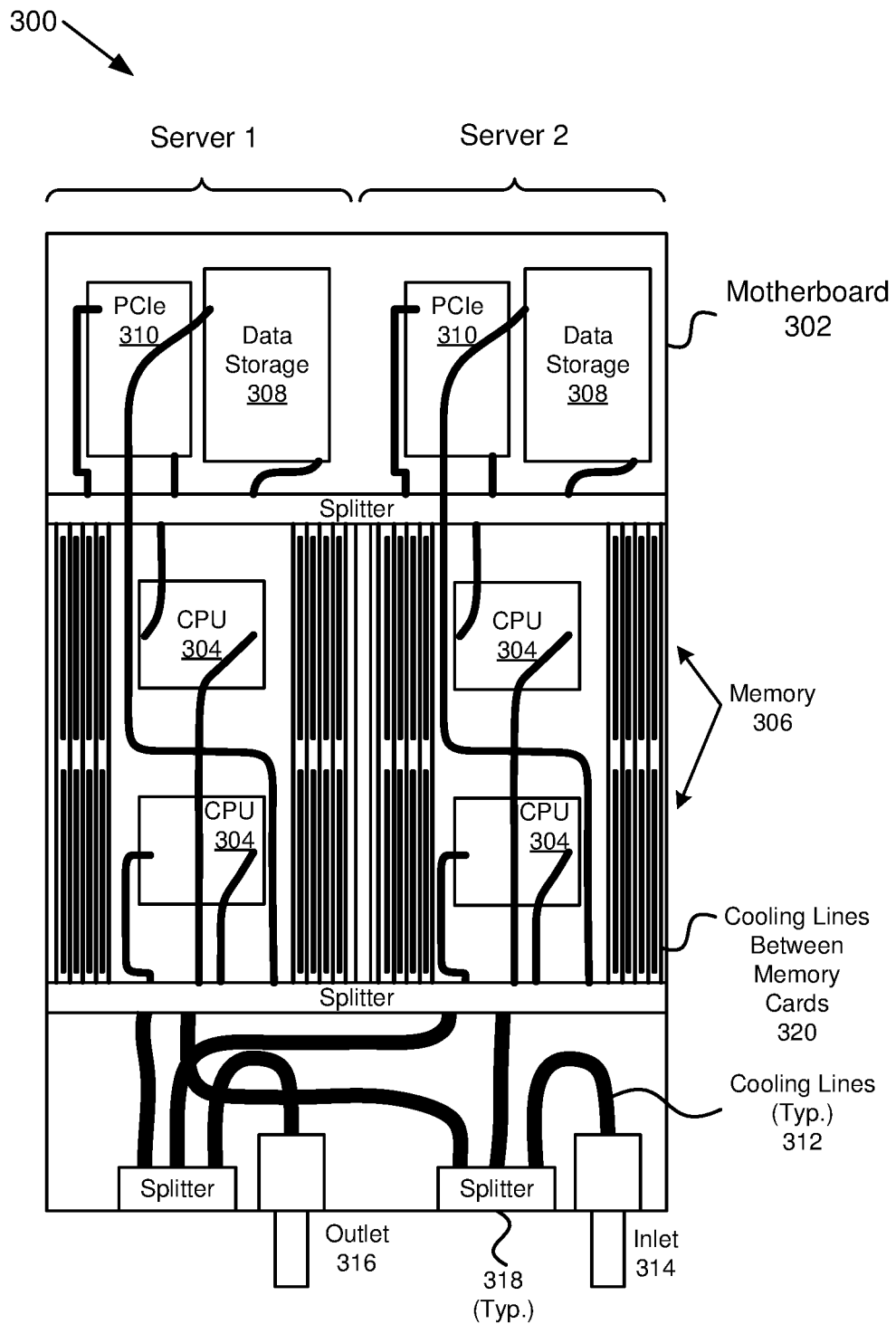
FIG. 3 is a schematic block diagram illustrating an example of a motherboard with CPUs that include devices with different cooling requirements than other devices of the CPUs, according to various embodiments.

FIG. 3 is a schematic block diagram 300 illustrating an example of a motherboard 302 with CPUs 304 that include devices with different cooling requirements than other devices of the CPUs 304, according to various embodiments. The motherboard 302 includes two side-by-side servers in a single rack-mounted tray. In addition to the CPUs 304, the motherboard 302 includes memory 306, data storage 308, and Peripheral Component Interchange Express ("PCIe") cards 310. The CPUs 304, memory 306, data storage 308, and PCIe cards 310 are all cooled by a single-phase cooling loop with cooling lines 312 depicted as black lines running between the CPUs 304, memory 306, data storage 308, and PCIe cards 310. The motherboard 302 is merely representative of other motherboards with one or more components with temperature sensitive requirements adjacent to other less sensitive components.

Figure 4:
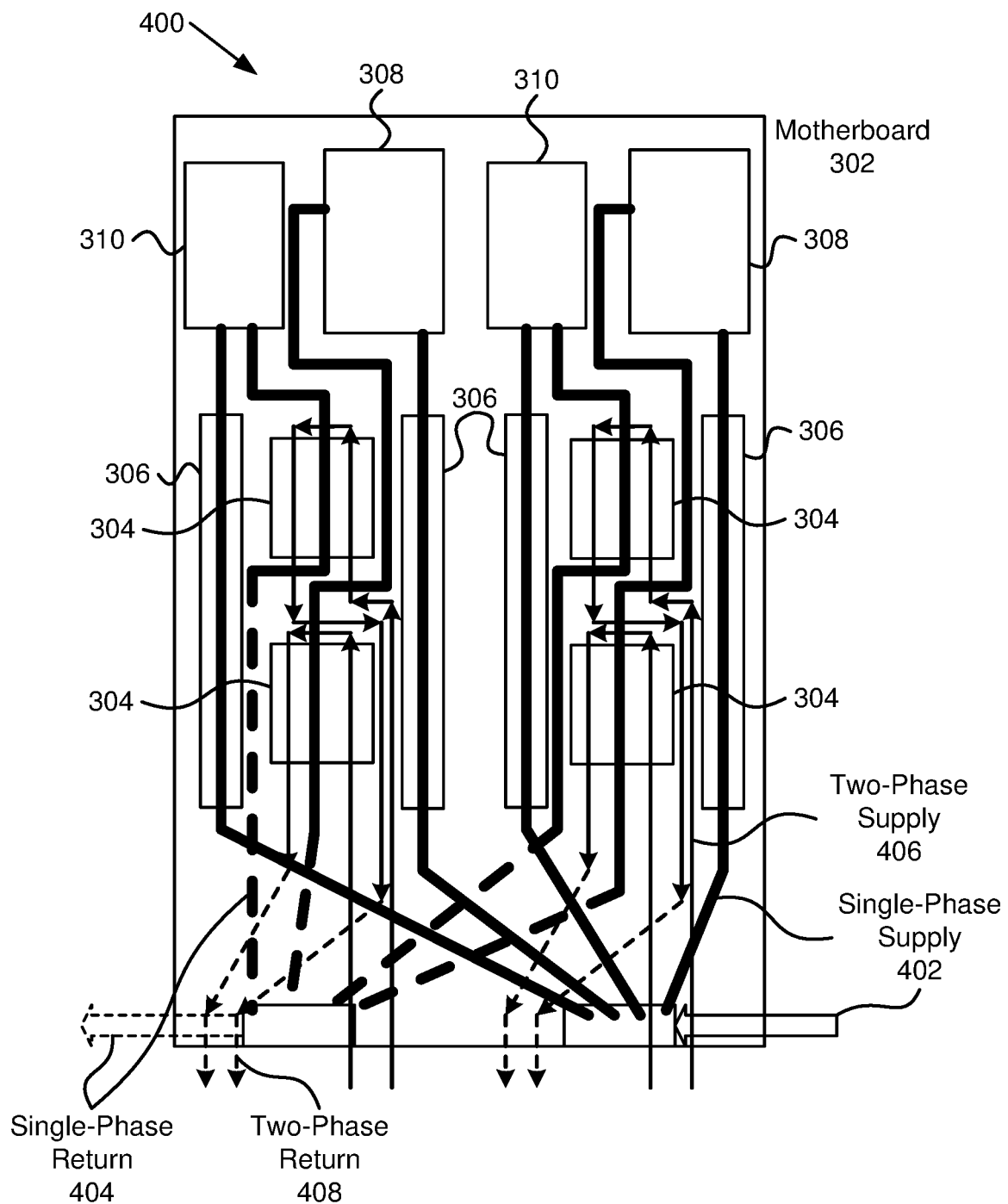
FIG. 4 is a schematic block diagram illustrating the CPUs of FIG. 3 with cooling loops replaced with both two-phase cooling loops and single-phase cooling loops, according to various embodiments.

An inlet 314 receives cool fluid and an outlet 316 outputs fluid that is heated after heat removal and are typically configured to plug into connectors at one end of the tray. Splitters 318 receive fluid and are configured to split the fluid into smaller streams. In some embodiments, cooling lines 320 are routed between memory 306, such as dual in-line memory modules ("DIMMs"). As depicted in FIG. 4, the cooling lines 318 that serve the CPUs 304, in embodiments described herein, are altered to include both a single-phase cooling loop and two-phase cooling loops. The layout of the motherboard 302 of FIG. 3 is one example of motherboards and other printed circuit boards that may benefit from having both a single-phase cooling loop and two-phase cooling loops, as depicted in FIG. 4.

FIG. 4 is a schematic block diagram 400 illustrating the CPUs 304 of FIG. 3 with cooling loops replaced with both two-phase cooling loops and single-phase cooling loops, according to various embodiments. The CPUs 304, memory 306, data storage 308, and PCIe cards 310 are the same as those depicted as in FIG. 3. Single-phase supply lines 402 are depicted as wide, solid black lines and single-phase return lines 404 are depicted as wide, dashed black lines. Two-phase supply lines 406 are depicted as thin, solid black lines with arrows and two-phase return lines 408 are depicted as thin, dashed black lines with arrows. Note that the transitions between solid supply lines 402, 406 and dashed return lines 404, 408 is arbitrary since the supply lines 402, 406 pick up heat as they go.

The two-phase supply lines 406 traverse the motherboard 302 to a CPU 304 and run in the dielectric cooling zones 204 of the CPU 102 of FIG. 2 in an out-and-back pattern. The two-phase supply lines 406 are split into two loops per side; one for each CPU 304. The single-phase supply lines 402 loop through memory 306, data storage, 308, PCIe cards 310, and other components in addition to cooling a center cooling zone (e.g. water cooling zone 202) of the CPUs 304. The single-phase supply lines 402, single-phase return lines 404, two-phase supply lines 406, two-phase return lines 408 are routed arbitrarily to show functionality and one of skill in the art will recognize other ways to route the single-phase supply lines 402, single-phase return lines 404, two-phase supply lines 406, two-phase return lines 408, with splitters 318 and other cooling line routing equipment as necessary.

Routing of the supply and return lines 402, 404, 406, 408, in some embodiments, originate and terminate at one end of the motherboard 302, as in FIG. 3, to mate with connectors. In addition, the supply and return lines 402, 404, 406, 408, in some embodiments, are split differently and are routed differently than shown. The diagram 400 of FIG. 4 is intended to convey the principles of a single-phase cooling loop (e.g. single phase supply and return lines 402, 404) cooling a portion of the CPUs 304 and other components 306, 308, 310 while the two-phase cooling loops (e.g. two-phase supply and return lines 406, 408) are cooling area of the CPUs 304 with temperature sensitive components, such as HBMs 206.

Figure 5:
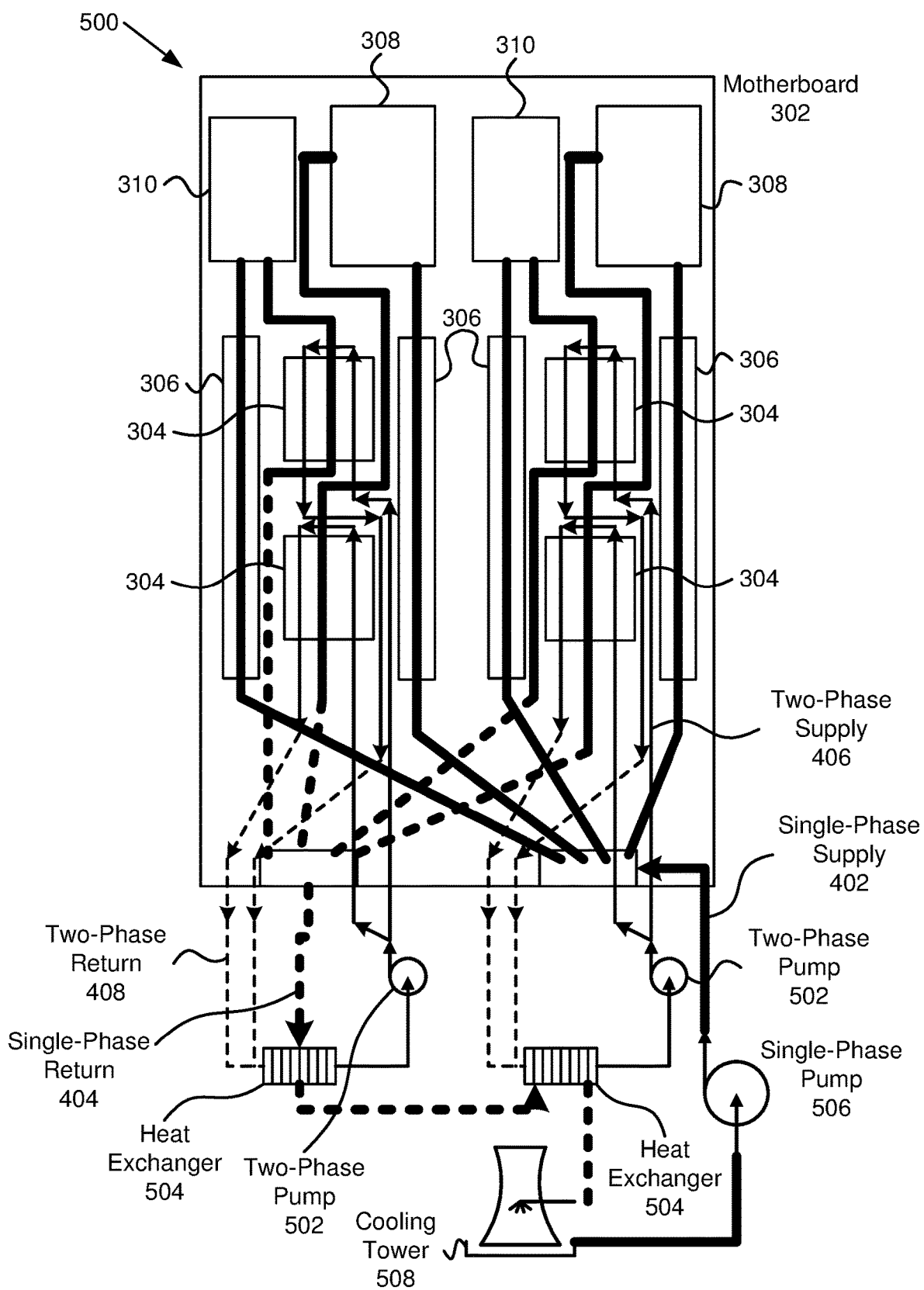
FIG. 5 is a schematic block diagram illustrating a system with a motherboard with single-phase and two-phase cooling loops, according to various embodiments.

FIG. 5 is a schematic block diagram illustrating a system 500 with a motherboard 302 with single-phase and two-phase cooling loops, according to various embodiments. The system 500 includes a motherboard 302 with CPUs 304, memory 306, data storage 308, PCIe cards 310, single phase supply and return lines 402, 404, and two-phase supply and return lines 406, 408, which are substantially similar to those described above in relation to the motherboard 302 of FIG. 4.

The two-phase supply and return lines 406, 408 include one or more two-phase pumps 502 that pump dielectric fluid through the two-phase supply and return lines 406, 408 and one or more heat exchangers 504. In some embodiments, the two-phase supply and return lines 406, 408 are part of a two-phase closed loop at a particular pressure and with a particular dielectric fluid so that when heat is transferred from the temperature sensitive components of the CPUs 304 at a selected temperature where at least a portion of the dielectric fluid changes to a gas at the selected temperature so that there is at least some gas in the dielectric fluid leaving the CPUs 304. The dielectric fluid in a state of a mixture of gas bubbles in liquid dielectric fluid is pumped to the heat exchangers 504 where heat is removed and the dielectric fluid returns to a liquid form before being pumped again to the CPUs 304.

In some embodiments, the single-phase loop (e.g. single-phase supply and return lines 402, 404) include one or more single-phase pumps 506 that circulate the single-phase fluid, such as water and/or glycol through the single-phase supply and return lines 402, 404 and a cooling tower 508 and/or chiller (not shown). A cooling tower 508 typically uses evaporative cooling to remove heat from water or other fluid suitable for exposure to the air around the cooling tower 508. As water evaporates, additional water is added so the single-phase loop with a cooling tower 508 is an open loop. A chiller may also remove heat from a single-phase cooling loop, usually at warmer temperatures where a temperature differential between outside air and the single-phase fluid is not adequate for evaporative cooling. In some embodiments, the single-phase cooling loop includes one or more cooling towers 508 and/or one or more chillers.

In some embodiments, the single-phase supply and return lines 402, 404 are routed through liquid-to-liquid heat exchangers 504 of the two-phase cooling loop and remove heat from the heat exchangers 504. In other embodiments, another method is used to remove heat from the heat exchangers 504, such as air flow (e.g. a liquid-to-air heat exchanger), another single-phase cooling loop, etc. While two two-phase pumps 502 are depicted, more or less two-phase pumps 502 may be included. One of skill in the art will recognize other ways to remove heat from a closed loop two-phase cooling loop.

Figure 6:
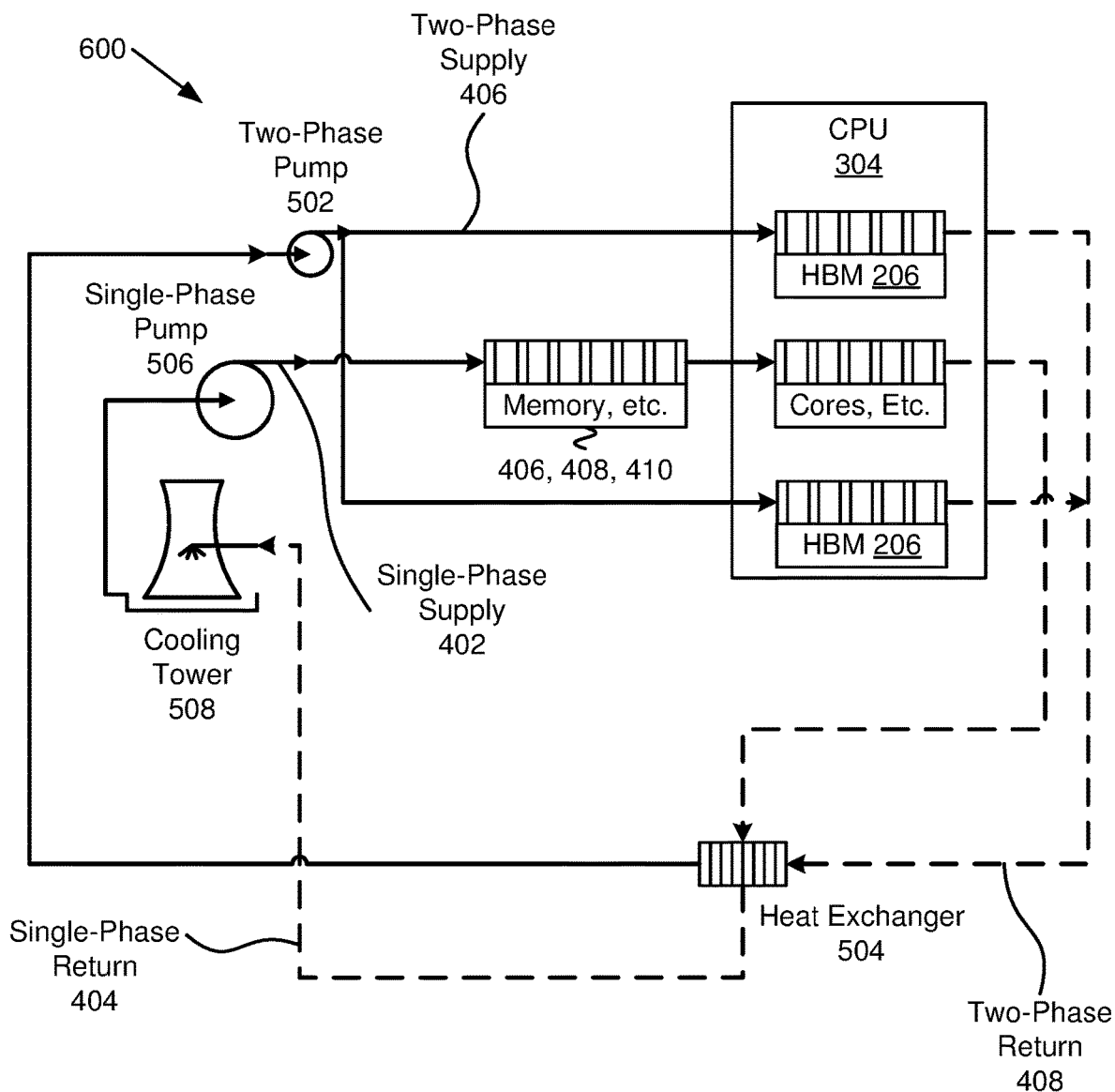
FIG. 6 is a schematic block diagram illustrating a single-phase cooling loop and two-phase cooling loop flow diagram, according to various embodiments.

FIG. 6 is a schematic block diagram illustrating a single-phase cooling loop and two-phase cooling loop flow diagram 600, according to various embodiments. The flow diagram 600 includes a two-phase pump 502 feeding two-phase supply lines 406 to heat sensitive components (e.g. HBMs 206) of a CPU 304 and two-phase return lines 408 from the temperature sensitive components to a heat exchanger 504, which then flows into the two-phase pump 502.

A single-phase pump 506 feeds a single-phase supply line 402 that circulates single-phase fluid through memory 306, data storage 308, PCIe cards 310, etc. of a motherboard 302, and then to cores and other components of a CPU 304. A single-phase return line 404 exits the CPU 304 and, in some embodiments, is routed through the heat exchanger 504 before returning to a cooling tower 508 (and/or chiller). Single-phase fluid from the cooling tower 508 goes to the single-phase pump 506. While one two-phase pump 502 and one single-phase pump 506 are depicted, one of skill in the art will recognize that additional pumps 502, 506 may be included. In addition, more than one heat exchanger 504, cooling tower 508, and/or chiller may be included.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
  a single-phase cooling loop routed through a first part of a component, the component comprising semiconductor devices, the single-phase cooling loop comprising a fluid configured to remain in a liquid state after removing heat from the first part of the component; and
  a two-phase cooling loop routed through a second part of the component, the two-phase cooling loop comprising a dielectric fluid configured to at least partially transition from a liquid state to a gas state at a selected temperature while removing heat from a semiconductor device of the second part of the component,
  wherein semiconductor devices of the first part of the component comprise a temperature requirement higher than a temperature requirement of the semiconductor device of the second part of the component.

2. The apparatus of claim 1, wherein the two-phase cooling loop is a closed loop comprising a pump and a heat exchanger for removing heat from the two-phase cooling loop after removing heat from the second part of the component.

3. The apparatus of claim 2, wherein the heat exchanger is one of a liquid-to-air heat exchanger or a liquid-to-liquid heat exchanger.

4. The apparatus of claim 2, wherein the heat exchanger is a liquid-to-liquid heat exchanger and wherein a first liquid of the heat exchanger is the dielectric fluid and a second liquid of the heat exchanger is the fluid of the single-phase cooling loop.

5. The apparatus of claim 1, wherein the second part of the component comprises sections separated from each other and the two-phase cooling loop is split into two or more loops that each traverse a section of the second part of the component.

6. The apparatus of claim 1, wherein the dielectric fluid of the two-phase cooling loop and a pressure of the two-phase cooling loop are selected to maintain the selected temperature of the semiconductor device of the second part of the component.

7. The apparatus of claim 1, wherein the single-phase cooling loop cools the first part of one or more components and cools additional components of a motherboard and wherein the two-phase cooling loop cools the second part of two or more components of the motherboard.

8. The apparatus of claim 1, wherein the single-phase cooling loop is an open loop.

9. The apparatus of claim 1, wherein the fluid of the single-phase cooling loop is water.

10. An apparatus comprising:
   a single-phase cooling loop routed through a first part of one or more components of a motherboard, the one or more components comprising semiconductor devices, the single-phase cooling loop comprising a fluid configured to remain in a liquid state after removing heat from the first part of the one or more components; and
   a two-phase cooling loop routed through a second part of the one or more components of the motherboard, the two-phase cooling loop comprising a dielectric fluid configured to at least partially transition from a liquid state to a gas state at a selected temperature while removing heat from a semiconductor device of the second part of the one or more components,
   wherein semiconductor devices of the first part of the one or more components comprise a temperature requirement higher than a temperature requirement of the semiconductor device of the second part of the one or more components.

11. The apparatus of claim 10, wherein the single-phase cooling loop cools one or more additional components of the motherboard.

12. The apparatus of claim 10, wherein the two-phase cooling loop is a closed loop comprising a pump and a heat exchanger for removing heat from the two-phase cooling loop after removing heat from the second part of the one or more components.

13. The apparatus of claim 12, wherein the heat exchanger is a liquid-to-liquid heat exchanger and wherein a first liquid of the heat exchanger is the dielectric fluid and a second liquid of the heat exchanger is the fluid of the single-phase cooling loop.

14. The apparatus of claim 10, wherein the second part of the one or more components comprises sections separated from each other and the two-phase cooling loop is split into two or more loops that each traverse a section of the second part of the one or more components.

15. The apparatus of claim 10, wherein the dielectric fluid of the two-phase cooling loop and a pressure of the two-phase cooling loop are selected to maintain the selected temperature of the semiconductor device of the second part of the one or more components.

16. A system comprising:
   a motherboard comprising one or more components, the one or more components of the motherboard comprising a first part and a second part, each of the first part and the second part comprising semiconductor devices;
   a single-phase cooling loop routed through the first part of the one or more components of the motherboard, the single-phase cooling loop comprising a single-phase fluid configured to remain in a liquid state after removing heat from the first part of each of the one or more components;
   a two-phase cooling loop routed through the second part of the one or more components of the motherboard, the two-phase cooling loop comprising a dielectric fluid configured to at least partially transition from a liquid state to a gas state at a selected temperature while removing heat from a semiconductor device of the second part of the one or more components, wherein semiconductor devices of the first part of the one or more components comprise a temperature requirement higher than a temperature requirement of the semiconductor device of the second part of the one or more components;
   a two-phase pump in the two-phase cooling loop configured to pump the dielectric fluid through the two-phase cooling loop;
   a single-phase pump in the single-phase cooling loop configured to pump the single-phase fluid through the single-phase cooling loop;
   a heat exchanger in the two-phase cooling loop configured to remove heat from the dielectric fluid of the two-phase cooling loop; and
   a cooling tower and/or chiller in the single-phase cooling loop configured to remove heat from the single-phase fluid of the single-phase loop.

17. The system of claim 16, wherein the motherboard comprises one or more additional components and wherein the single-phase cooling loop cools the one or more additional components.

* * * * *